(12) United States Patent
Xie et al.

(10) Patent No.: US 9,691,897 B2
(45) Date of Patent: Jun. 27, 2017

(54) THREE-DIMENSIONAL SEMICONDUCTOR TRANSISTOR WITH GATE CONTACT IN ACTIVE REGION

(71) Applicant: GLOBALFOUNDRIES Inc., Grand Caymay (KY)

(72) Inventors: Ruilong Xie, Schenectady, NY (US); Andre Labonte, Mechanicville, NY (US); Andreas Knorr, Saratoga Springs, TX (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/867,193

(22) Filed: Sep. 28, 2015

(65) Prior Publication Data

US 2017/0092764 A1   Mar. 30, 2017

(51) Int. Cl.
| | | |
|---|---|---|
| H01L 21/02 | (2006.01) | |
| H01L 29/78 | (2006.01) | |
| H01L 29/423 | (2006.01) | |
| H01L 29/45 | (2006.01) | |
| H01L 29/66 | (2006.01) | |

(52) U.S. Cl.
CPC .... *H01L 29/7845* (2013.01); *H01L 29/42356* (2013.01); *H01L 29/45* (2013.01); *H01L 29/6656* (2013.01); *H01L 29/66795* (2013.01); *H01L 29/785* (2013.01)

(58) Field of Classification Search
CPC .............. H01L 29/45; H01L 29/42356; H01L 29/6656; H01L 29/66795; H01L 29/785; H01L 29/7845
USPC ........................................................ 257/384
See application file for complete search history.

(56) References Cited

U.S. PATENT DOCUMENTS

| | | | | |
|---|---|---|---|---|
| 2012/0193712 A1* | 8/2012 | Bryant | .............. | H01L 29/41791 257/347 |
| 2013/0164890 A1* | 6/2013 | Basker | .............. | H01L 29/66795 438/151 |
| 2013/0175596 A1* | 7/2013 | Cheng | ................ | H01L 27/0629 257/310 |

\* cited by examiner

*Primary Examiner* — Matthew Gordon
(74) *Attorney, Agent, or Firm* — Wayne F. Reinke, Esq.; Heslin Rothenberg Farley & Mesiti P.C.

(57) ABSTRACT

A three-dimensional transistor includes a semiconductor substrate, a fin coupled to the substrate, the fin including an active region across a top portion thereof, the active region including a source, a drain and a channel region therebetween. The transistor further includes a gate situated above the channel region, and a gate contact situated in the active region, no portion thereof being electrically coupled to the source or drain. The transistor is achieved by removing a portion of the source/drain contact situated beneath the gate contact during fabrication.

5 Claims, 10 Drawing Sheets

THREE-DIMENSIONAL SEMICONDUCTOR TRANSISTOR WITH GATE CONTACT IN ACTIVE REGION

BACKGROUND OF THE INVENTION

Technical Field

The present invention generally relates to three-dimensional semiconductor transistors and the fabrication thereof. More particularly, the present invention relates to gate contacts for three-dimensional semiconductor transistors and the fabrication thereof in the active region without gate-to-source/drain shorts.

Background Information

Conventional fabrication of FinFET semiconductor structures places the gate contact outside of the active region, to avoid gate contact to source/drain contact short circuits. However, doing so may result in design restrictions and uses more area. As semiconductor devices continue to shrink, the loss of semiconductor real estate becomes more and more of an issue.

Thus, a need exists to reduce the footprint of a three-dimensional semiconductor transistor while also allowing for downward scaling.

SUMMARY OF THE INVENTION

The shortcomings of the prior art are overcome and additional advantages are provided through the provision, in one aspect, of a method of forming a gate contact in an active region. The method includes providing a starting semiconductor structure, the structure including a semiconductor substrate, at least one fin coupled to the substrate, isolation material surrounding a bottom portion of the at least one fin, epitaxial semiconductor material at a top portion of each fin, a trench silicide contact above the epitaxial semiconductor material and a gate structure with cap and spacers. The method further includes removing a portion of the trench silicide contact below the gate structure.

In accordance with another aspect, a semiconductor structure is provided. The structure includes a semiconductor substrate and at least one fin coupled thereto and having an active area with a source, a drain and a gate encompassing a portion of the at least one fin. The structure further includes a trench silicide contact for each of the source and drain and a gate contact, a top portion of each contact situated at a same level in the active area, a portion of each trench silicide contact being partially located below a bottom surface of the gate contact.

In accordance with yet another aspect, a three-dimensional semiconductor transistor is provided. The transistor includes a semiconductor substrate, a fin coupled to the substrate, the fin including an active region across a top portion thereof, the active region including a source, a drain and a channel region therebetween. The transistor further includes a gate situated above the channel region, a gate contact situated in the active region, a top portion of the gate contact being at a same level as a top portion of a source contact and a drain contact, each of the source contact and the drain contact having a portion thereof located below the gate contact while electrical contact is maintained between an entirety of a top surface of each of the source and the drain, and the source contact and the drain contact, respectively.

These, and other objects, features and advantages of this invention will become apparent from the following detailed description of the various aspects of the invention taken in conjunction with the accompanying drawings.

DETAILED DESCRIPTION OF THE INVENTION

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

Figure 1:
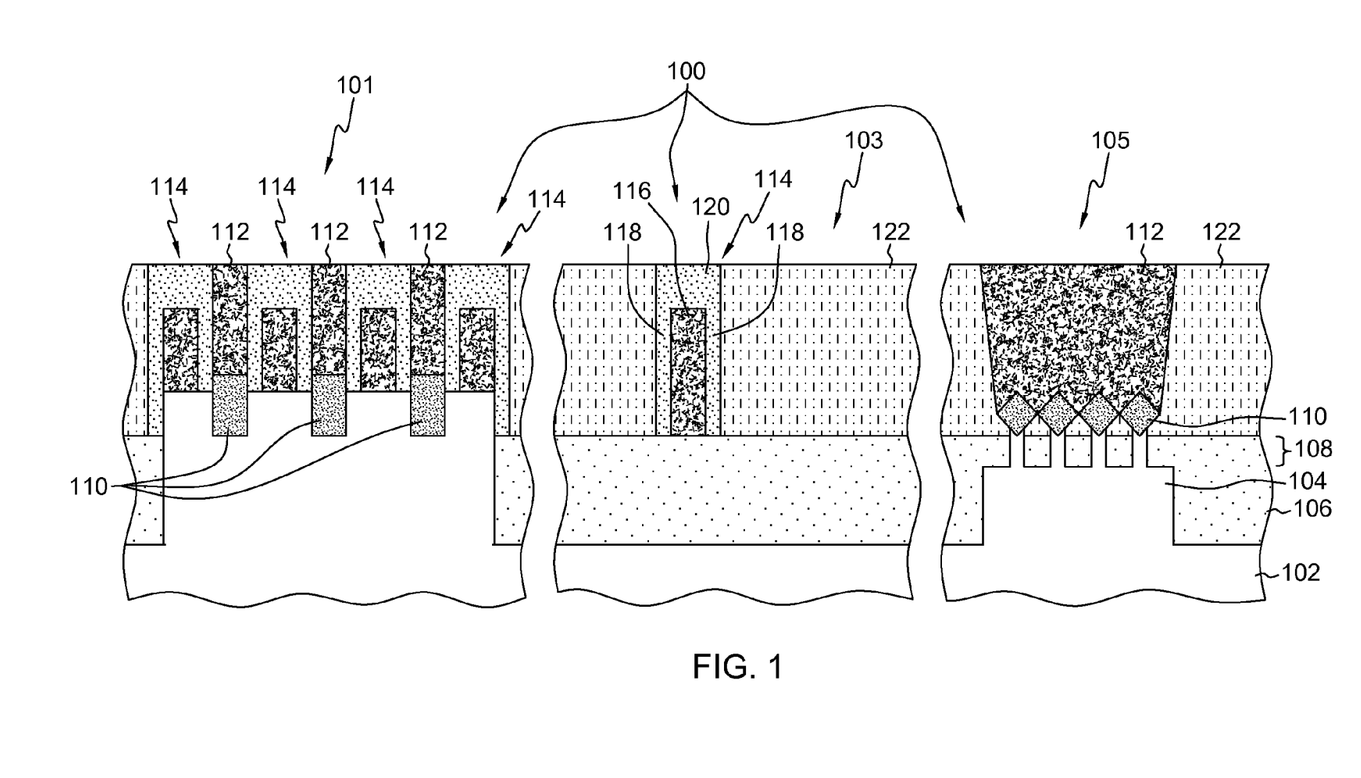
FIG. 1 includes three cross-sectional views of one example of a starting semiconductor structure, the structure including a semiconductor substrate, fins coupled to the substrate, a bottom portion of the fins surrounded by isolation material and a top portion thereof recessed with epitaxial material thereon (source/drain) and a trench silicide contact thereabove, the structure also including gate structures, each gate structure surrounding a portion of the fins and including one or more conductive materials surrounded by spacers and a gate cap, the gate structures and surrounded by a top dielectric layer, in accordance with one or more aspects of the present invention.

FIG. 1 includes three cross-sectional views 101, 103 and 105 of one example of a starting semiconductor structure 100, the structure including a semiconductor substrate 102, fins 104 coupled to the substrate, a bottom portion of the fins surrounded by isolation material 106 and a top portion thereof 108 recessed with epitaxial material 110 thereon (source/drain, e.g., by growth) and trench silicide contact 112 thereabove, the structure also including gate structures 114, each gate structure surrounding a portion of the fins and including one or more conductive materials 116 surrounded by spacers (e.g., spacers 118) and a gate cap (e.g., gate cap 120), the gate structures and silicide surrounded by a top dielectric layer 122 (e.g., an inter-layer dielectric), in accordance with one or more aspects of the present invention. The gate structure may be a dummy gate structure or conductive (metal) gate structure.

The starting structure may be conventionally fabricated, for example, using known processes and techniques. Further, unless noted otherwise, conventional processes and techniques may be used to achieve individual steps of the fabrication process described herein. However, although only a portion is shown for simplicity, it will be understood that, in practice, many such structures are typically included on the same bulk substrate.

In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

In one example, the fins 104 may be etched from a bulk substrate, and may include, for example, any of the materials listed above with respect to the substrate. Further, some or all of the fins may include added impurities (e.g., by doping), making them n-type or p-type.

Figure 2:
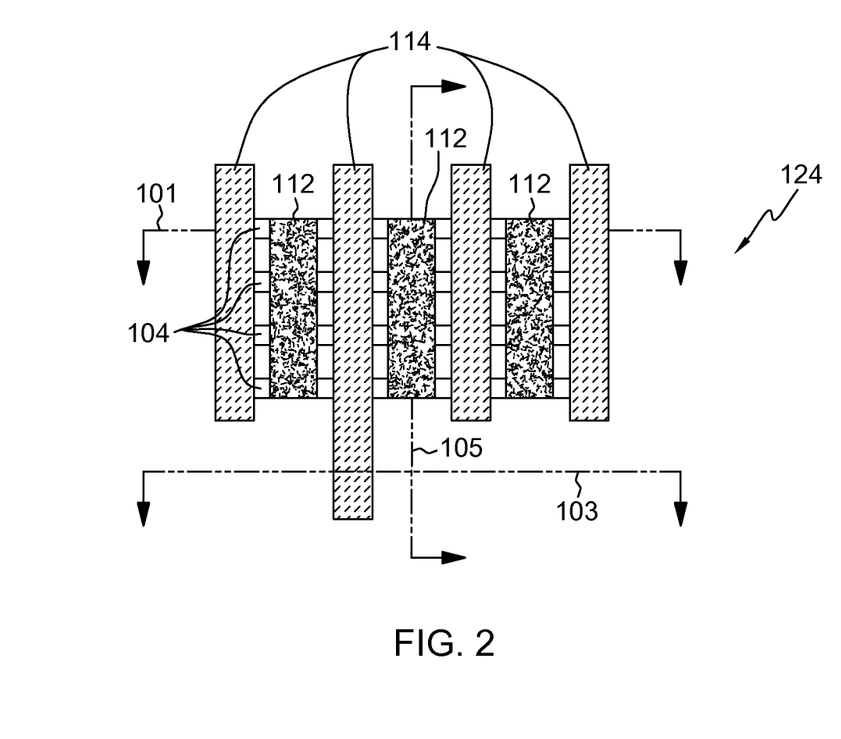
FIG. 2 is a top-down view clarifying one example of a major portion of the starting semiconductor structure of FIG. 1, the major portion including gate structures, fins and a trench silicide contact, as well as showing the various cross-sectional views of FIG. 1, in accordance with one or more aspects of the present invention.

FIG. 2 is a top-down view clarifying one example of a major portion 124 of the starting semiconductor structure 100 of FIG. 1, the major portion including gate structures 114, fins 104 and trench silicide contact 112, as well as showing the various cross-sectional views 101, 103, 105 of FIG. 1, in accordance with one or more aspects of the present invention.

Figure 3:
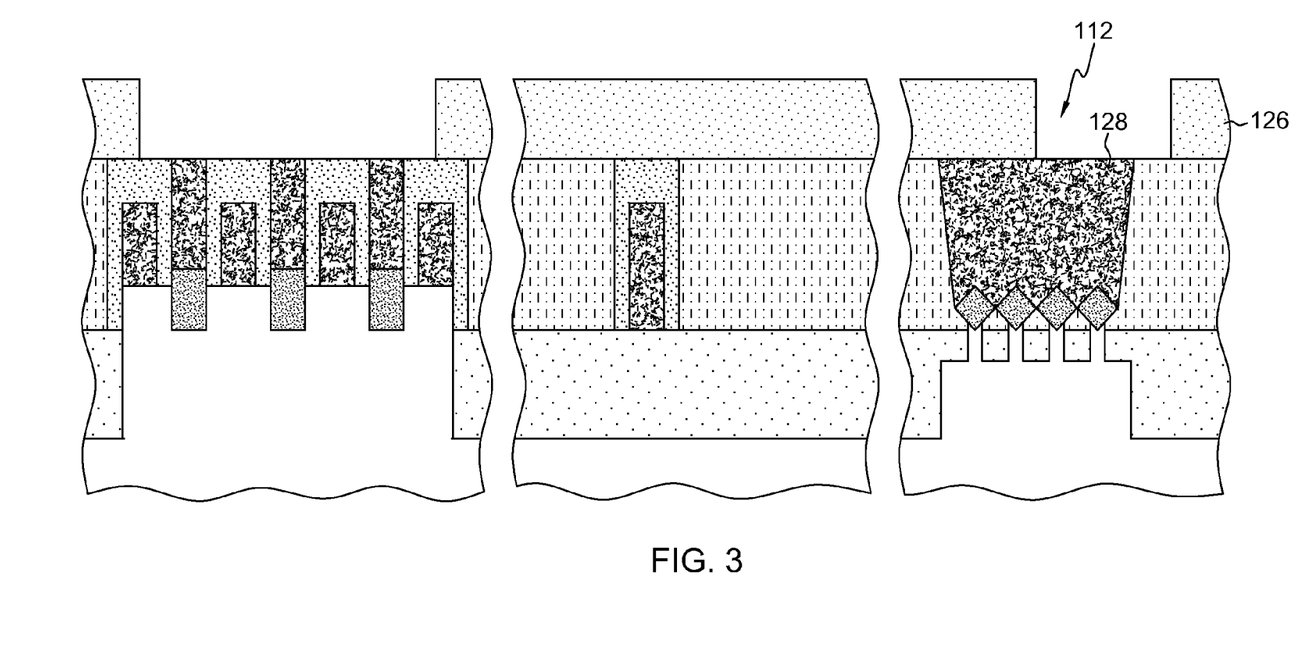
FIG. 3 depicts one example of the structure of FIG. 1 after forming a mask layer over the structure and patterning to expose portions of the trench silicide contact, in accordance with one or more aspects of the present invention.

FIG. 3 depicts one example of the structure of FIG. 1 after forming a mask layer 126 over the structure and patterning to expose portions (e.g., portion 128) of the trench silicide contact 112, in accordance with one or more aspects of the present invention. See FIG. 10 for a top-down view of the mask layer opening.

In one example, the mask layer of FIG. 3 may include, for example, an organic planarizing material, and may be formed using, for example, lithography.

Figure 4:
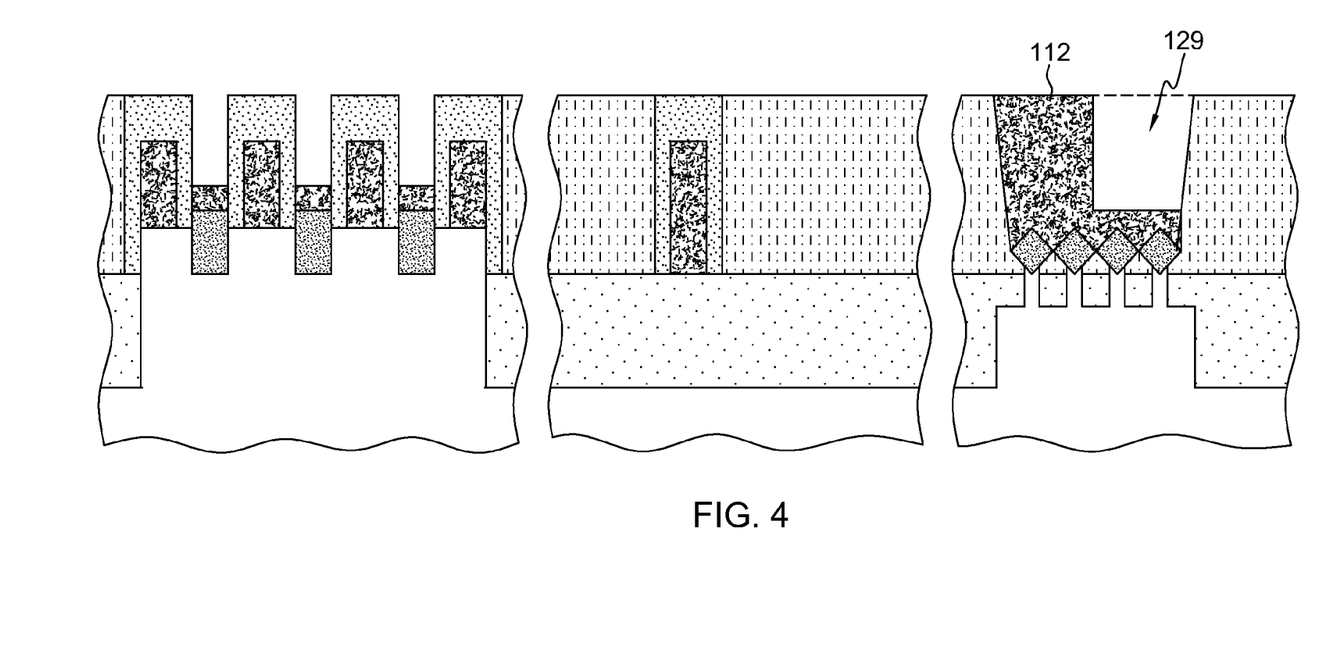
FIG. 4 depicts one example of the structure of FIG. 3 after removal of a portion of the silicide, removal of the mask and planarizing, in accordance with one or more aspects of the present invention.

FIG. 4 depicts one example of the structure of FIG. 3 after removal of a portion 129 of the silicide 112 that may otherwise cause a short with the as-yet un-fabricated gate contact, and removal of the mask (126, FIG. 3), in accordance with one or more aspects of the present invention.

In one example, the trench silicide contact may include a thin layer of silicide (e.g., about 5 nm) above the source/drain epitaxial material and one or more conductive metals above silicide, for example, tungsten, and may also include liner material, for example, titanium or titanium nitride, and partial removal of the conductive metal may be accomplished using, for example, a fixed-time dry etch process. In the present example, the portion of the trench silicide portion of the contact remaining has a roughly L-shape.

Figure 5:
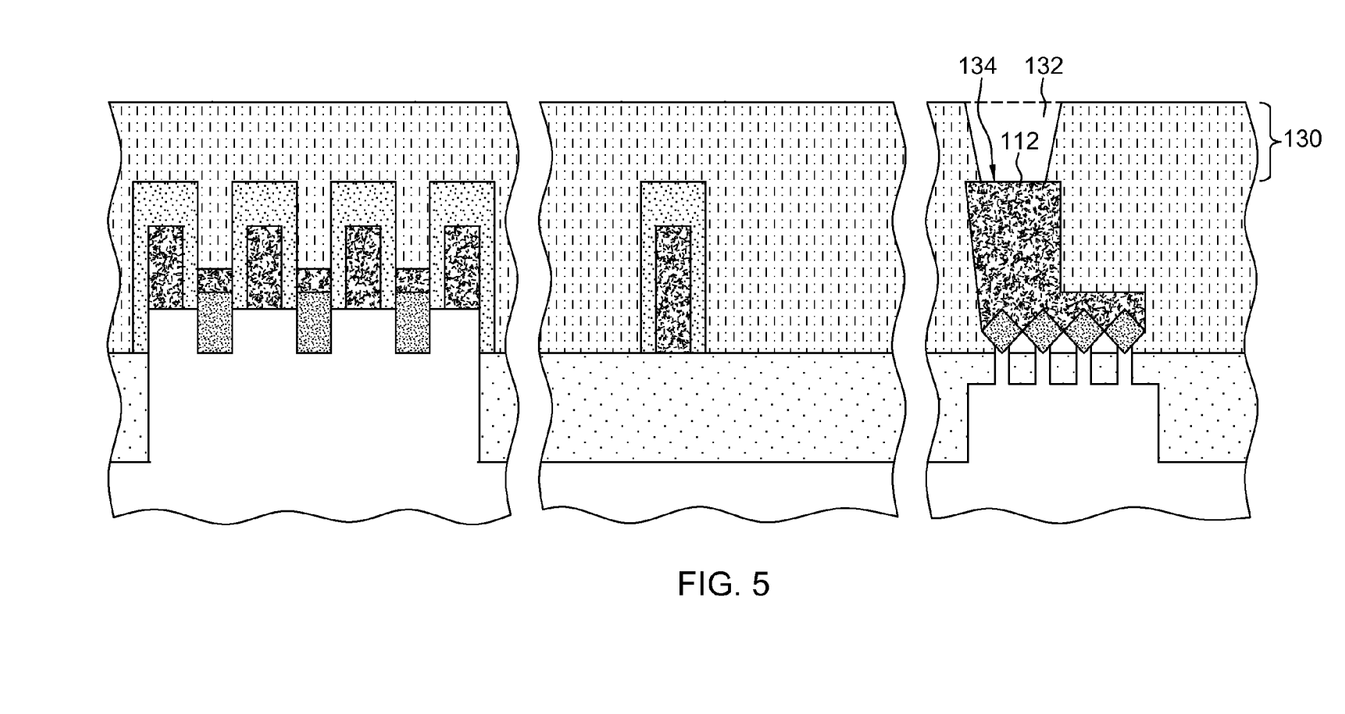
FIG. 5 depicts one example of the structure of FIG. 4 after forming a blanket additional dielectric layer over the structure and removing a portion of the blanket additional dielectric layer, exposing a top surface of the trench silicide contact, in accordance with one or more aspects of the present invention.

FIG. 5 depicts one example of the structure of FIG. 4 after forming a blanket additional dielectric layer 130 over the structure and removing a portion 132 of the blanket additional dielectric layer, exposing a top surface 134 of the trench silicide contact 112, in accordance with one or more aspects of the present invention.

In one example, the structure of FIG. 5 may be realized by, for example, forming a dielectric layer (e.g., silicon dioxide), for example, using a chemical-vapor deposition process, planarizing the dielectric layer, for example, using a chemical-mechanical polishing process, and performing an additional lithographic/etch process to form the trench which exposes the trench silicide contact. For a top-down view of the trench, see FIG. 10.

Figure 6:
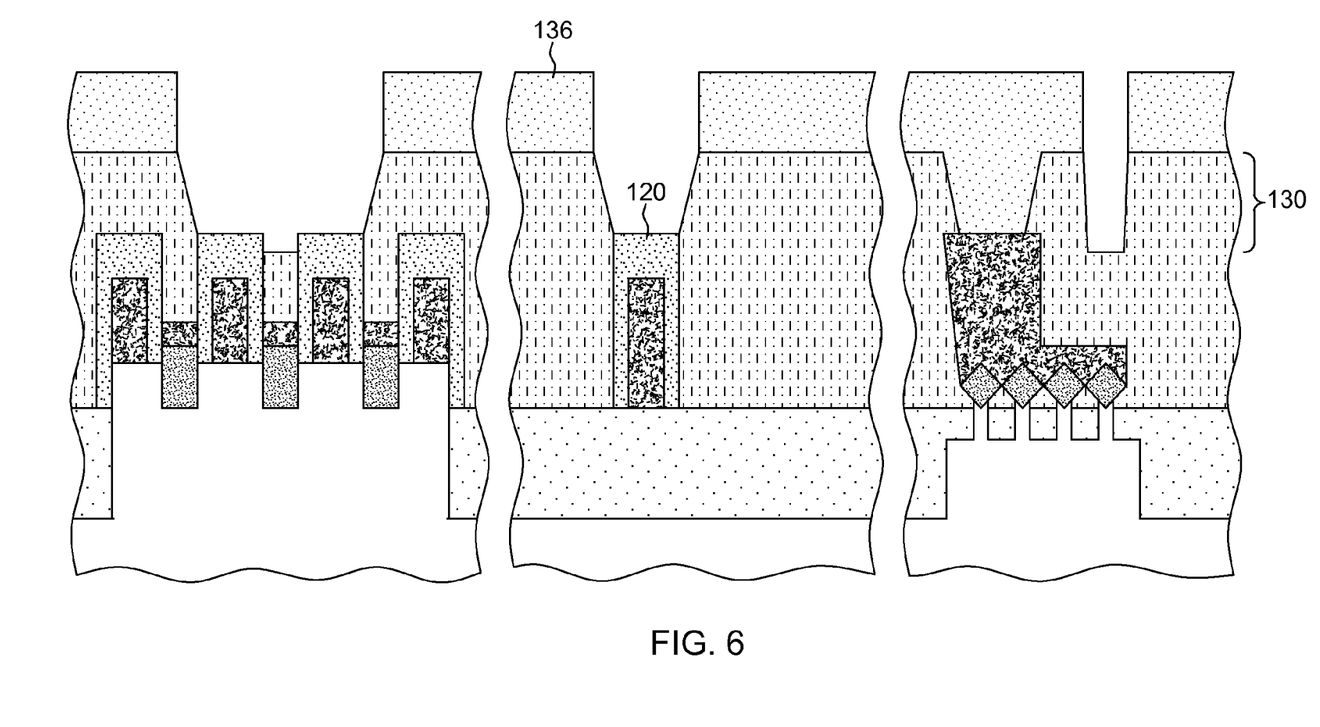
FIG. 6 depicts one example of the structure of FIG. 5 after forming a blanket conformal mask layer, similar to the mask layer of FIG. 3, patterning thereof for gate contact(s) and removal of portion(s) of the additional dielectric layer (e.g., by fixed-time etch), exposing the gate cap(s), in accordance with one or more aspects of the present invention.

FIG. 6 depicts one example of the structure of FIG. 5 after forming a blanket conformal mask layer 136, similar to the mask layer of FIG. 3, patterning thereof for gate contact(s) and removal of portion(s) of the additional dielectric layer 130 (e.g., by fixed-time etch), exposing the gate cap(s) (e.g., gate cap 120), in accordance with one or more aspects of the present invention.

Figure 7:
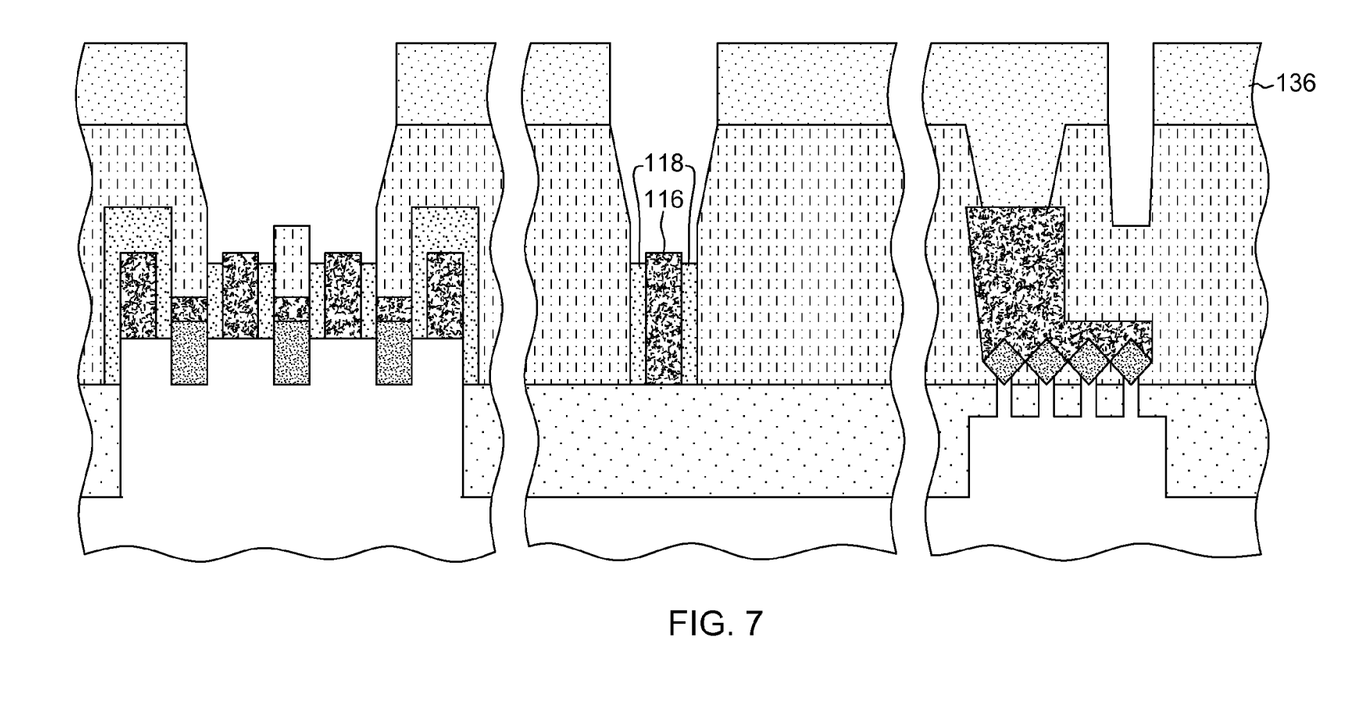
FIG. 7 depicts one example of the structure of FIG. 6 after selective removal of the gate cap(s) and top portions of the associated spacers, exposing the gate(s), in accordance with one or more aspects of the present invention.

FIG. 7 depicts one example of the structure of FIG. 6 after selective removal of the gate cap(s) (e.g., gate cap 120) and top portions of the associated spacers (e.g., spacers 118), exposing the gate(s) (e.g., gate 116), in accordance with one or more aspects of the present invention.

In one example, selective removal of the gate cap(s) and top portions of the spacers may be accomplished using, for example, a dry etch process that removes silicon nitride cap and spacers selective to surrounding dielectric layer(s) (e.g., oxide).

Figure 8:
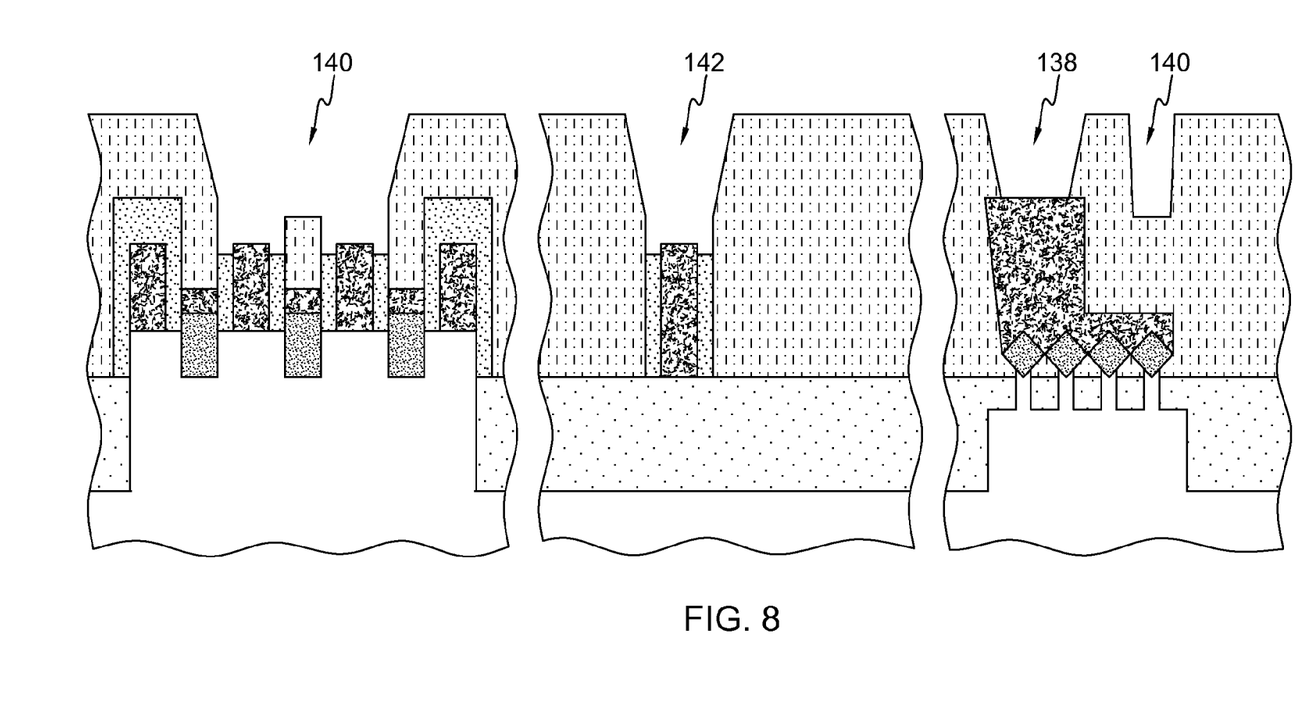
FIG. 8 depicts one example of the structure of FIG. 7 after removal of the mask layer, e.g., using an ashing process, in accordance with one or more aspects of the present invention.

FIG. 8 depicts one example of the structure of FIG. 7 after removal of the mask layer (136, FIG. 7), e.g., using an ashing process, in accordance with one or more aspects of the present invention.

Figure 9:
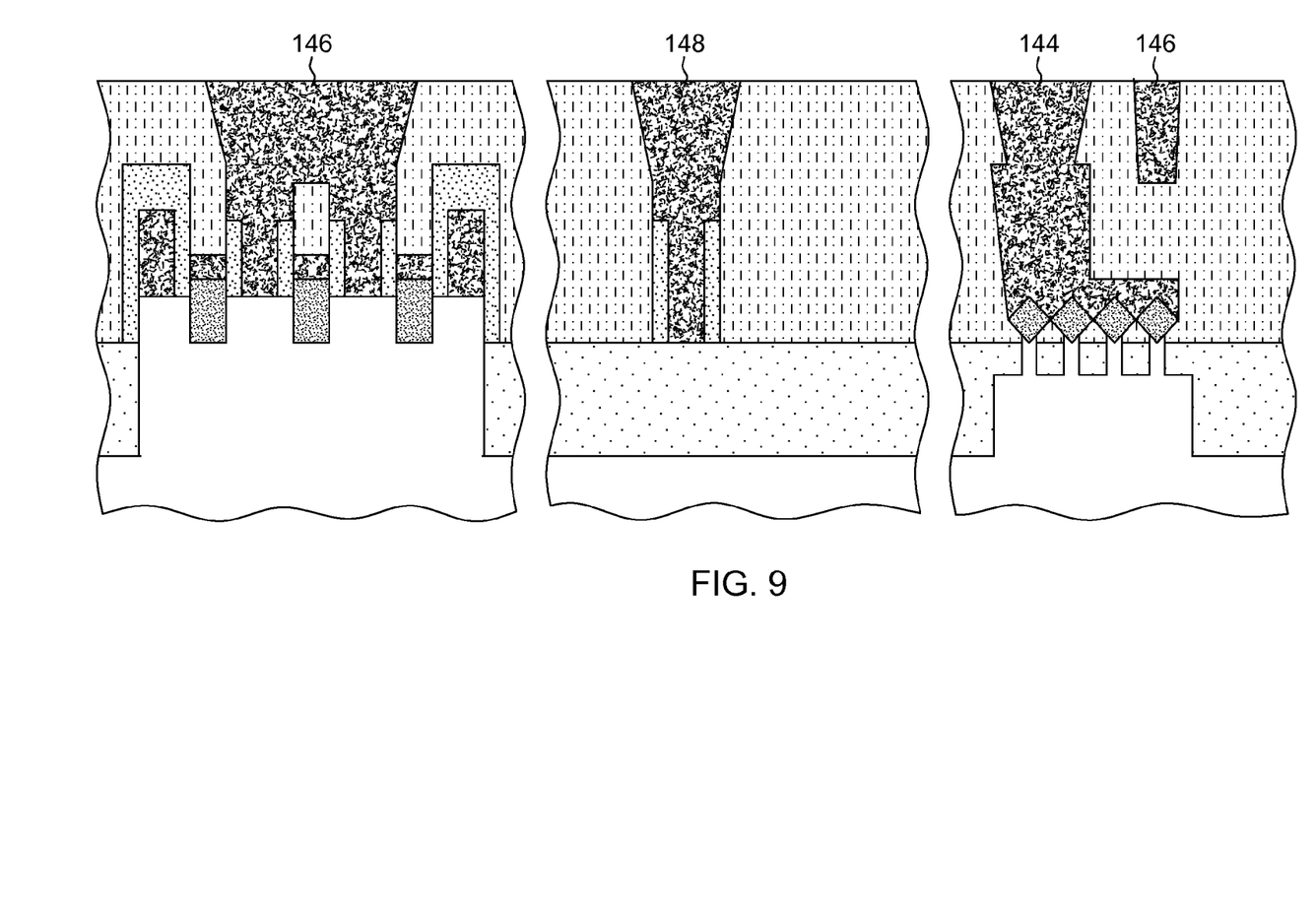
FIG. 9 depicts one example of the structure of FIG. 8 after filling the openings (source/drain and gate contacts, separately or together) for the source/drain and gate(s) with one or more conductive materials, creating contacts, in accordance with one or more aspects of the present invention.

FIG. 9 depicts one example of the structure of FIG. 8 after filling the openings (source/drain and gate contacts, separately or together) for the source/drain and gate(s) (FIG. 7, 138, 140 and 142) with one or more conductive materials, creating contacts 144, 146 and 148, respectively, in accordance with one or more aspects of the present invention.

In one example, the conductive material used for filling may include, for example, tungsten, and the filling may include, for example, over filling and then planarizing down to the dielectric material (e.g., using a chemical-mechanical polishing process).

Figure 10:
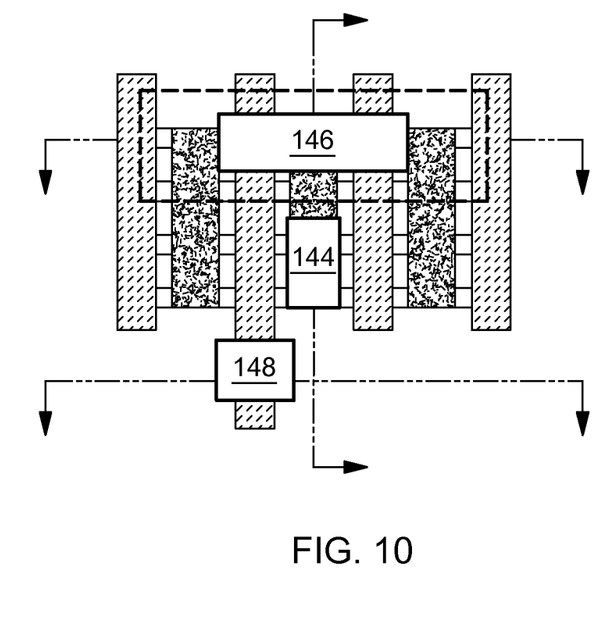
FIG. 10 is one example of a top-down view of major portions of the structure of FIG. 9, including contacts, in accordance with one or more aspects of the present invention.

FIG. 10 is one example of a top-down view of major portions of the structure of FIG. 9, including contacts 144, 146 and 148, in accordance with one or more aspects of the present invention.

In a first aspect, disclosed above is a method. The method includes providing a starting semiconductor structure, the structure including a semiconductor substrate, fin(s) coupled to the substrate, isolation material surrounding a bottom portion of the fin(s), epitaxial semiconductor material at a top portion of each fin, a trench silicide contact above the epitaxial semiconductor material and a gate structure with cap and spacers. The method further includes removing a portion of the trench silicide contact below the gate structure.

In one example, the method may further include, for example, exposing part of a non-removed portion of the trench silicide contact, exposing the gate, and forming contacts for the source, drain and gate.

In one example, removing a portion of the trench silicide contact below the gate structure in the method of the first aspect may include, for example, forming a protective layer over the structure except above the portion of trench silicide contact, and removing the portion of the trench silicide contact. In one example, the protective layer may include, for example, an organic planarization layer, and the removing may include, for example, performing an ashing process.

In one example, exposing part of a non-removed portion of the trench silicide contact includes using a lithographic and etch process.

In one example, exposing the gate in the method of the first aspect may include, for example, forming a blanket conformal dielectric layer over the structure, forming a protective layer over the structure except above the at least one gate, exposing the gate cap and a top portion of the spacers, and removing the exposed gate cap and top portion of the spacers, exposing the gate.

In one example, the protective layer may include, for example, an organic planarizing layer (OPL), and exposing the gate cap and spacers may include, for example, performing a fixed time etch. In another example, removing the exposed gate cap and top portion of the spacers may include, for example, performing an etch selective to the blanket conformal dielectric layer.

In one example, forming contact(s) for the gate(s) in the method of the first aspect may include, for example, forming layer(s) of work function material.

In one example, forming contacts for the gate(s) in the method of the first aspect may include, for example, filling with one or more metals.

In one example, forming contacts for the source(s), drain(s) and gate(s) in the method of the first aspect may include, for example, a common metal fill.

In a second aspect, disclosed above is a semiconductor structure. The structure includes a semiconductor substrate and fin(s) coupled thereto and having an active area with a source, a drain and a gate encompassing a portion of the fin(s). The structure further includes a trench silicide contact for each of the source and drain and a gate contact, each contact situated in the active area, the trench silicide contacts being partially recessed below the gate contact.

In one example, the trench silicide contacts each include silicide and conductive metal(s).

In a third aspect, disclosed above is a three-dimensional semiconductor transistor. The transistor includes a semiconductor substrate, a fin coupled to the substrate, the fin including an active region across a top portion thereof, the active region including a source, a drain and a channel region therebetween. The transistor further includes a gate situated above the channel region, and a gate contact situated in the active region, with no portion thereof being electrically coupled to the source or drain.

In one example, the transistor may further include, for example, a source contact and a drain contact, each of the source contact and the drain contact including a portion thereof removed below the gate contact while full electrical contact is maintained with the source and drain. In one example, the source contact and the drain contact may each have, for example, a roughly L-shaped portion in direct contact with the source and drain.

In one example, the semiconductor substrate of the three-dimensional transistor of the third aspect may include, for example, a bulk semiconductor substrate with the fin(s) coupled thereto.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A semiconductor structure, comprising:
a semiconductor substrate and at least one fin coupled thereto and having an active area with a source, a drain and a gate encompassing a portion of the at least one fin;
a trench silicide contact for each of the source and drain and a gate contact, a top portion of each contact situated at a same level in the active area; and
wherein a portion of each trench silicide contact is partially located below a bottom surface of the gate contact.

2. The semiconductor structure of claim 1, wherein each trench silicide contact comprises silicide and at least one conductive metal.

3. A three-dimensional semiconductor transistor, comprising:
a semiconductor substrate;
a fin coupled to the substrate, the fin comprising an active region across a top portion thereof, the active region comprising a source, a drain and a channel region therebetween;
a gate situated above the channel region;
a gate contact situated in the active region, wherein a top portion of the gate contact is at a same level as a top portion of a source contact and a drain contact; and
wherein each of the source contact and the drain contact has a portion thereof located below the gate contact while electrical contact is maintained between an entirety of a top surface of each of the source and the drain, and the source contact and the drain contact, respectively.

4. The three-dimensional transistor of claim 3, wherein the source contact and the drain contact each have a roughly L-shaped portion in direct contact with the source and the drain.

5. The three-dimensional transistor of claim 3, wherein the semiconductor substrate comprises a bulk semiconductor substrate with a plurality of the fins coupled thereto.

* * * * *